United States Patent
Murata et al.

(10) Patent No.: US 11,415,468 B2
(45) Date of Patent: Aug. 16, 2022

(54) THERMOELECTRIC GENERATOR TRANSMITTER

(71) Applicant: KELK Ltd., Kanagawa (JP)

(72) Inventors: Tomonori Murata, Kanagawa (JP); Daisuke Goto, Kanagawa (JP)

(73) Assignee: KELK Ltd., Kanagawa (JP)

( * ) Notice: Subject to any disclaimer, the term of this patent is extended or adjusted under 35 U.S.C. 154(b) by 475 days.

(21) Appl. No.: 16/615,898

(22) PCT Filed: Mar. 26, 2018

(86) PCT No.: PCT/JP2018/012172
§ 371 (c)(1),
(2) Date: Nov. 22, 2019

(87) PCT Pub. No.: WO2018/216345
PCT Pub. Date: Nov. 29, 2018

(65) Prior Publication Data
US 2020/0149976 A1 May 14, 2020

(30) Foreign Application Priority Data
May 26, 2017 (JP) .............................. JP2017-104149

(51) Int. Cl.
*H01L 35/32* (2006.01)
*G01K 7/02* (2021.01)
(Continued)

(52) U.S. Cl.
CPC .............. *G01K 7/02* (2013.01); *G01K 1/024* (2013.01); *G01K 1/026* (2013.01); *G01K 1/12* (2013.01);
(Continued)

(58) Field of Classification Search
CPC .......... G01K 7/02; G01K 1/024; G01K 1/026; G01K 1/12; G01K 13/08; H01L 35/32;
(Continued)

(56) References Cited

U.S. PATENT DOCUMENTS

2004/0000713 A1  1/2004  Yamashita et al.
2009/0184829 A1  7/2009  Rivers
(Continued)

FOREIGN PATENT DOCUMENTS

CN  101493358  7/2009
CN  102214784  10/2011
(Continued)

OTHER PUBLICATIONS

International Preliminary Report on Patentability in PCT Appln. No. PCT/JP201 8/012172, dated Nov. 26, 2019, 6 pages, English translation.
(Continued)

*Primary Examiner* — Gail Kaplan Verbitsky
(74) *Attorney, Agent, or Firm* — Fish & Richardson P.C.

(57) ABSTRACT

A thermoelectric generator transmitter includes: a hollow exterior frame having open ends; a heat-receiving plate covering one of the open ends of the exterior frame; a columnar member standing on the heat-receiving plate; a thermoelectric generation module arranged for facilitating heat transfer between the columnar member and the thermoelectric generation module; a radiator plate covering a part of the other one of the open ends of the exterior frame, the part corresponding to a location of the thermoelectric generation module; a processor drivable by electricity generated by the thermoelectric generation module and capable of outputting a detection signal detected by a sensor to an external device; and a terminal that receives the detection signal of the sensor from the external device. An inside of
(Continued)

the exterior frame is divided into a location of the thermo-electric generation module and the processor and a location of the terminal.

6 Claims, 8 Drawing Sheets

(51) Int. Cl.
    *G01K 1/024* (2021.01)
    *G01K 1/02* (2021.01)
    *G01K 1/12* (2006.01)
    *G01K 13/08* (2006.01)
    *G08C 19/00* (2006.01)
    *H02N 11/00* (2006.01)
    *H01L 35/28* (2006.01)

(52) U.S. Cl.
    CPC .............. *G01K 13/08* (2013.01); *H01L 35/32* (2013.01); *G08C 19/00* (2013.01); *H01L 35/28* (2013.01); *H02N 11/00* (2013.01)

(58) Field of Classification Search
    CPC ......... H01L 35/28; G08C 15/00; G08C 19/00; H02N 11/00
    See application file for complete search history.

(56) References Cited

U.S. PATENT DOCUMENTS

| | | | |
|---|---|---|---|
| 2014/0158178 A1 | 6/2014 | Wong et al. | |
| 2014/0196758 A1* | 7/2014 | Kamimura | .............. H01L 35/30 136/212 |
| 2014/0216516 A1 | 8/2014 | Makino et al. | |
| 2017/0133571 A1 | 5/2017 | Ueno et al. | |

FOREIGN PATENT DOCUMENTS

| | | | | |
|---|---|---|---|---|
| CN | 103872235 | | 6/2014 | |
| CN | 103943770 | | 7/2014 | |
| CN | 106194355 A | * | 12/2016 | ............ H01L 35/30 |
| CN | 111699562 A | * | 9/2020 | ............ H01L 35/08 |
| CN | 112164746 A | * | 1/2021 | ............ H01L 35/30 |
| CN | 112670393 A | * | 4/2021 | ........... G02B 6/4204 |
| DE | 102016209315 A1 | * | 11/2017 | ............ H01L 35/30 |
| EP | 0945769 | * | 4/1991 | |
| EP | 0687020 A1 | * | 12/1995 | |
| EP | 1024415 A1 | * | 8/2000 | ............ G04C 10/00 |
| EP | 1965446 A1 | * | 9/2008 | ......... C03C 10/0027 |
| JP | 2001-255945 | | 9/2001 | |
| JP | 2003-113850 | | 4/2003 | |
| JP | 2008288535 A | * | 11/2008 | |
| JP | 2009290960 A | * | 12/2009 | |
| JP | 2013-080883 | | 5/2013 | |
| JP | 2014-008569 | | 1/2014 | |
| JP | 2014-138102 | | 7/2014 | |
| JP | 2016-157356 | | 9/2016 | |
| JP | 2016-194441 | | 11/2016 | |
| JP | 2017-093148 | | 5/2017 | |
| KR | 20090001178 U | * | 9/2002 | |
| KR | 20130122786 A | * | 10/2013 | |
| WO | WO-2010083542 A1 | * | 7/2010 | ......... A63B 21/0084 |
| WO | WO-2011039068 A2 | * | 4/2011 | ................ G01J 5/12 |
| WO | WO-2021065514 A1 | * | 4/2021 | |

OTHER PUBLICATIONS

JP Notice of Allowance for Japanese Application No. 2017-104149, dated Sep. 1, 2020, 2 pages (with English translation).
PCT International Search Report in International Appln. No. PCT/JP2018/012172, dated May 15, 2018, 2 pages.
CN Office Action in Chinese Application No. 201880032961.7, dated Sep. 2, 2020, 8 pages (with English translation).

* cited by examiner

THERMOELECTRIC GENERATOR TRANSMITTER

CROSS-REFERENCE TO RELATED APPLICATIONS

This application claims priority to International Application No. PCT/JP2018/012172 filed on Mar. 26, 2018, which claims priority to Japanese Application No. 2017-104149, filed on May 26, 2017, the contents of which are incorporated herein in their entirety.

TECHNICAL FIELD

The present invention relates to a thermoelectric generator transmitter.

BACKGROUND ART

For a sensing operation of temperature, strain and the like for maintenance and abnormality detection of equipment exposed to severe external environments at ironworks, factories and the like, a sensor network system, which collects sensor outputs to be outputted from a wireless sensor terminal provided to the equipment, has been typically known.

For instance, Patent Literature 1 discloses a wireless sensor terminal including: a solar cell module as an independent power supply; a power supply circuit connected to the solar cell module to form a power source; a sensor that detects detection target parameters (e.g., temperature and strain) on a basis of a voltage of the power supply from the power supply circuit; and a wireless-transmission-signal generating circuit that converts a signal detected by the sensor into a signal to be transmitted wirelessly.

CITATION LIST

Patent Literature(s)

Patent Literature 1: JP 2016-157356 A

SUMMARY OF THE INVENTION

Problem(s) to be Solved by the Invention

However, in the technique disclosed in Patent Literature 1, since the sensor and the solar cell module (i.e., the independent power supply) are provided inside the wireless sensor terminal, it is essential to generate sufficient power at a sensing part of a measurement target. Accordingly, a setting position of the wireless sensor terminal is restricted and an actual use of the wireless sensor terminal is difficult unless conditions are satisfied.

An object of the invention is to provide a thermoelectric generator transmitter capable of performing a sensing operation with use of an independent power supply for a long time while a setting position of the thermoelectric generator transmitter is less restricted.

Means for Solving the Problem(s)

According to an aspect of the invention, a thermoelectric generator transmitter outputs a detection signal detected by a sensor to an outside with use of thermoelectric generation, the thermoelectric generator transmitter having: a hollow exterior frame with heat resistance and a radio-wave transmissivity, the exterior frame including open ends; a heat-receiving plate covering a first one of the open ends of the exterior frame and attached to a heat generation source or a heat absorption source; a radiator plate covering at least one part of a second one of the open ends of the exterior frame; a columnar member standing on at least one of a surface of the heat-receiving plate covering the exterior frame or a surface of the radiator plate covering the exterior frame, the columnar member being arranged so as to facilitate heat transfer between the columnar member and the heat-receiving plate or between the columnar member and the radiator plate; a thermoelectric generation module provided between the columnar member standing on the heat-receiving plate and the radiator plate, between the columnar member standing on the heat-receiving plate and the columnar member standing on the radiator plate, or between the columnar member standing on the radiator plate and the heat-receiving plate, in which the thermoelectric generation module generates electricity by a temperature difference between the heat-receiving plate and the radiator plate; a processor provided to an inside of the exterior frame and that is drivable by electric power generated by the thermoelectric generation module and is capable of outputting the detection signal detected by the sensor to an external device; and a terminal that receives the detection signal of the sensor from the external device, in which the inside of the exterior frame is divided into a location of the thermoelectric generation module and the processor and a location of the terminal.

In the above aspect of the invention, since the location of the thermoelectric generation module and the processor is separated from the location of the terminal, the sensor can be attached to the terminal while the thermoelectric generation module is kept in close contact with the heat-receiving plate, the columnar member and the radiator plate.

Accordingly, without reducing the power generation of the thermoelectric generator transmitter, the independent power supply can perform a sensing operation for a long time.

Moreover, the transmitter can generate power with use of the independent power supply under the most suitable environments and perform a remote sensing of a measurement target with use of various sensors attached to the terminal.

BRIEF DESCRIPTION OF DRAWING(S)

Figure 8:
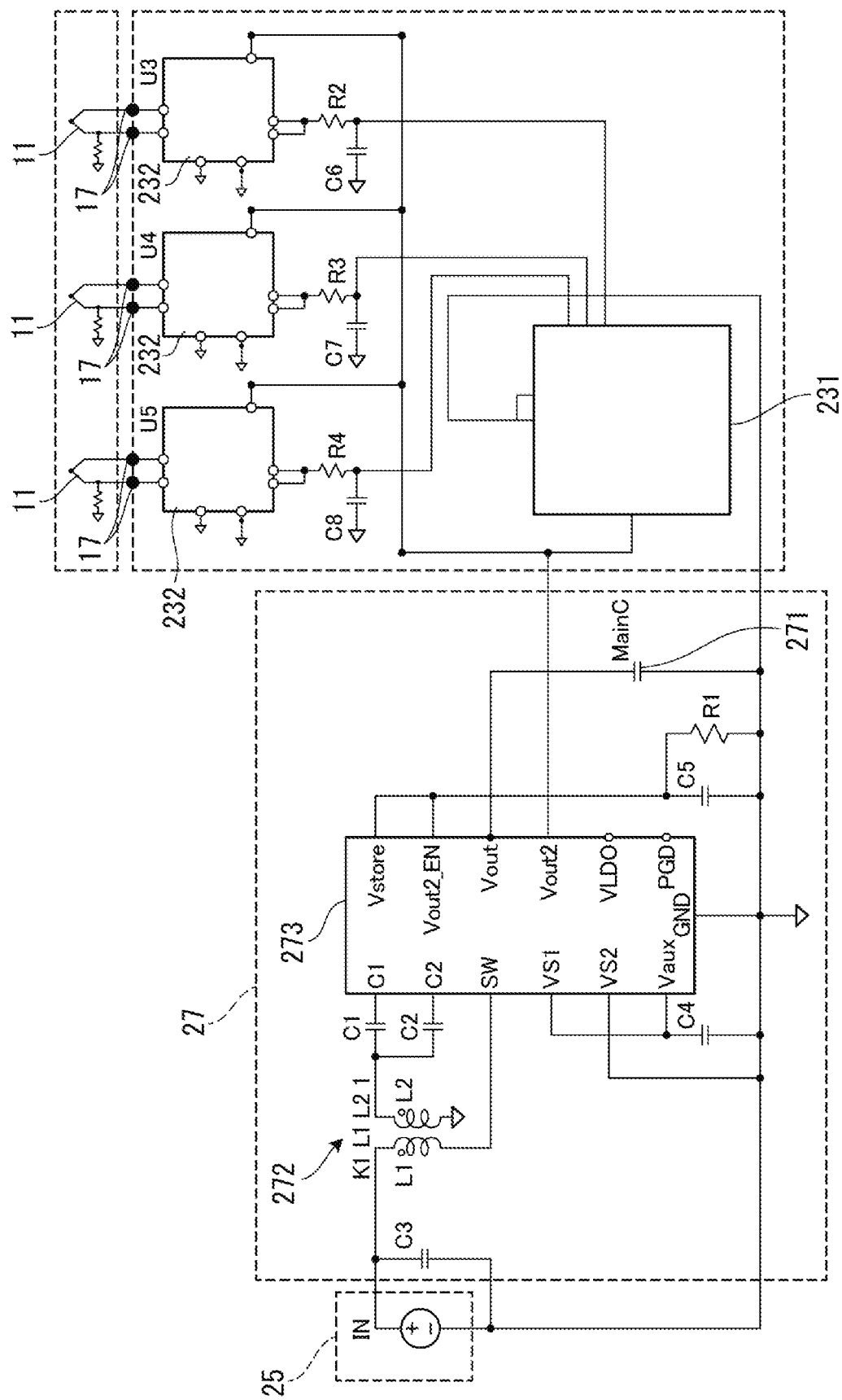

FIG. 8 schematically shows a circuit structure of the thermoelectric generator transmitter according to the exemplary embodiment.

DESCRIPTION OF EMBODIMENT(S)

[1] Column Type Milling Machine 1 Applied with Thermoelectric Generator Transmitter 10

Figure 1:
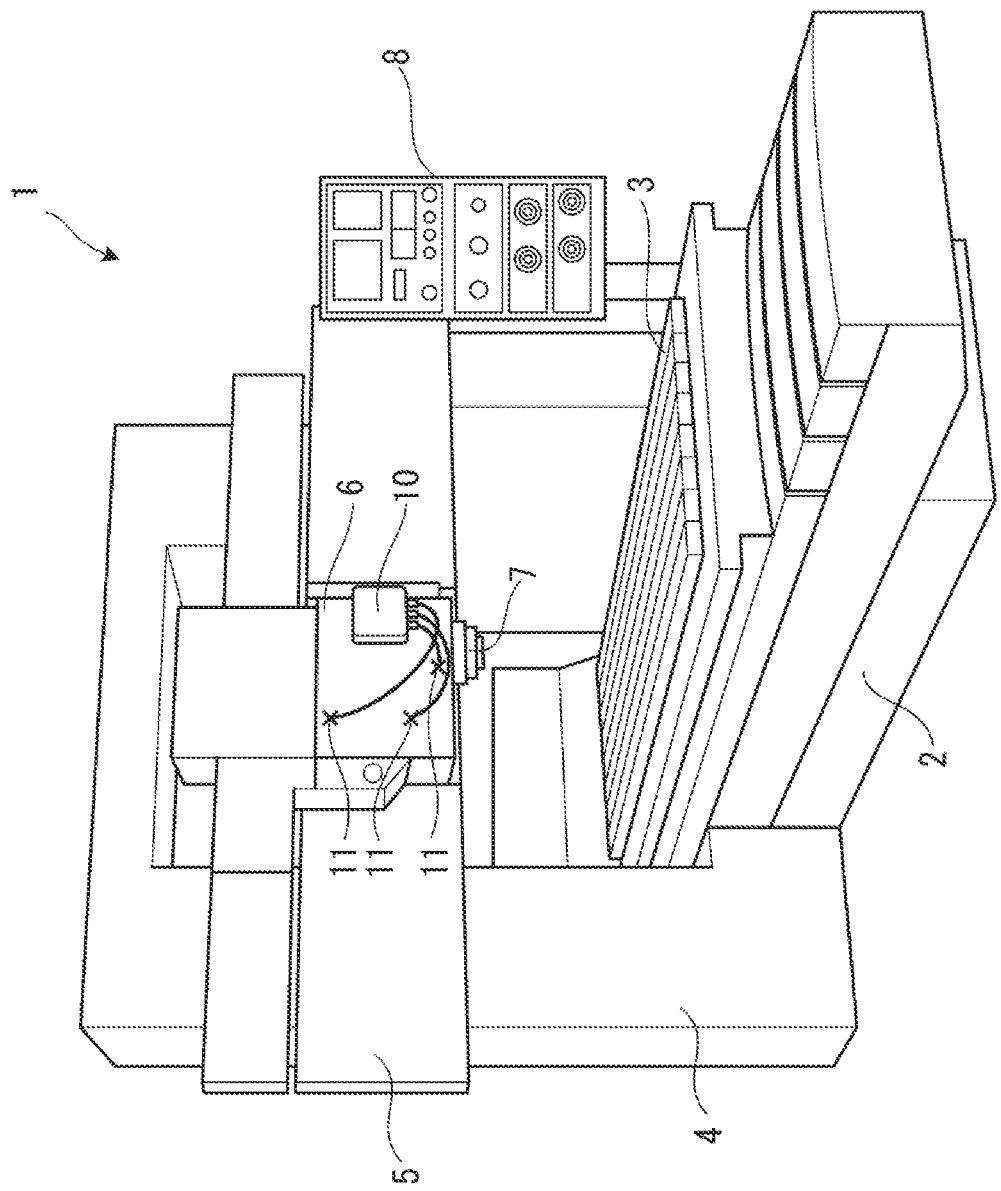
FIG. 1 shows a perspective view of a machine tool in which a thermoelectric generator transmitter according to an exemplary embodiment of the invention is used.

FIG. 1 shows a column type milling machine 1 in which a thermoelectric generator transmitter 10 according to an exemplary embodiment is used.

The column type milling machine 1, which machines a workpiece, includes a bed 2, table 3, column 4, cross rail 5, spindle head 6, spindle 7, and control panel 8.

The bed 2 is a base fixed with an anchor bolt and the like to an installation site of the column type milling machine 1.

The table 3 is mounted on the bed 2. A workpiece (target to be machined) is placed on the bed 2.

The column 4 has a portal shape. Both legs of the column 4 are movably provided along side edges of the bed 2 and the column 4 positions a machining tool in a Y direction (i.e., a longitudinal direction of the bed 2) relative to the workpiece.

The cross rail 5 is provided to the column 4 in a manner to be movable in a vertical direction and positions the machining tool in a Z direction (i.e., in the vertical direction of the bed 2) relative to the workpiece.

The spindle head 6 is provided to the cross rail 5 in a manner to be movable along the cross rail 5 and positions the machining tool in an X direction (i.e., in a width direction of the bed 2) relative to the workpiece. A motor for rotating the spindle 7 is provided inside the spindle head 6.

The spindle 7, which is provided to a tip end of the spindle head 6 and attached with various cutting tools, machines the workpiece.

The control panel 8 serves as a controller for positioning the column 4, the cross rail 5 and the spindle head 6 and for machining the workpiece with the cutting tool attached to the spindle 7. The control panel 8 includes a processor and a memory. For machining of the workpiece, the control panel 8 retrieves a program from the memory and executes the program to automatically machine the workpiece.

The thermoelectric generator transmitter 10 is attached to a part, where the motor is housed, of the spindle head 6 in the column type milling machine 1. The thermoelectric generator transmitter 10 includes a plurality of thermocouples 11. Each of the thermocouples 11 detects a temperature of each of parts of the spindle head 6, which affects a machining accuracy in precision machining, and measure a temperature distribution of the spindle head 6.

Although detailed later, the thermoelectric generator transmitter 10 is a transmitter that transmits the temperature detected by each of the thermocouples 11 to an external device with use of thermoelectric generation. The thermoelectric generator transmitter 10 includes: a thermoelectric generation module 25 (i.e., an independent power generator); and a processor 231 drivable by the thermoelectric generation module 25 (see FIG. 4). The detected temperature is remotely processed to analyze a state of the temperature distribution of the spindle head 6.

The thermoelectric generator transmitter 10 is attached to the part, where the motor (i.e., the heat generation source) is housed, of the spindle head 6 in the column type milling machine 1 and conducts thermoelectric generation by using heat generated by rotation of the motor inside.

[2] Structure of Thermoelectric Generator Transmitter 10

Figure 2:
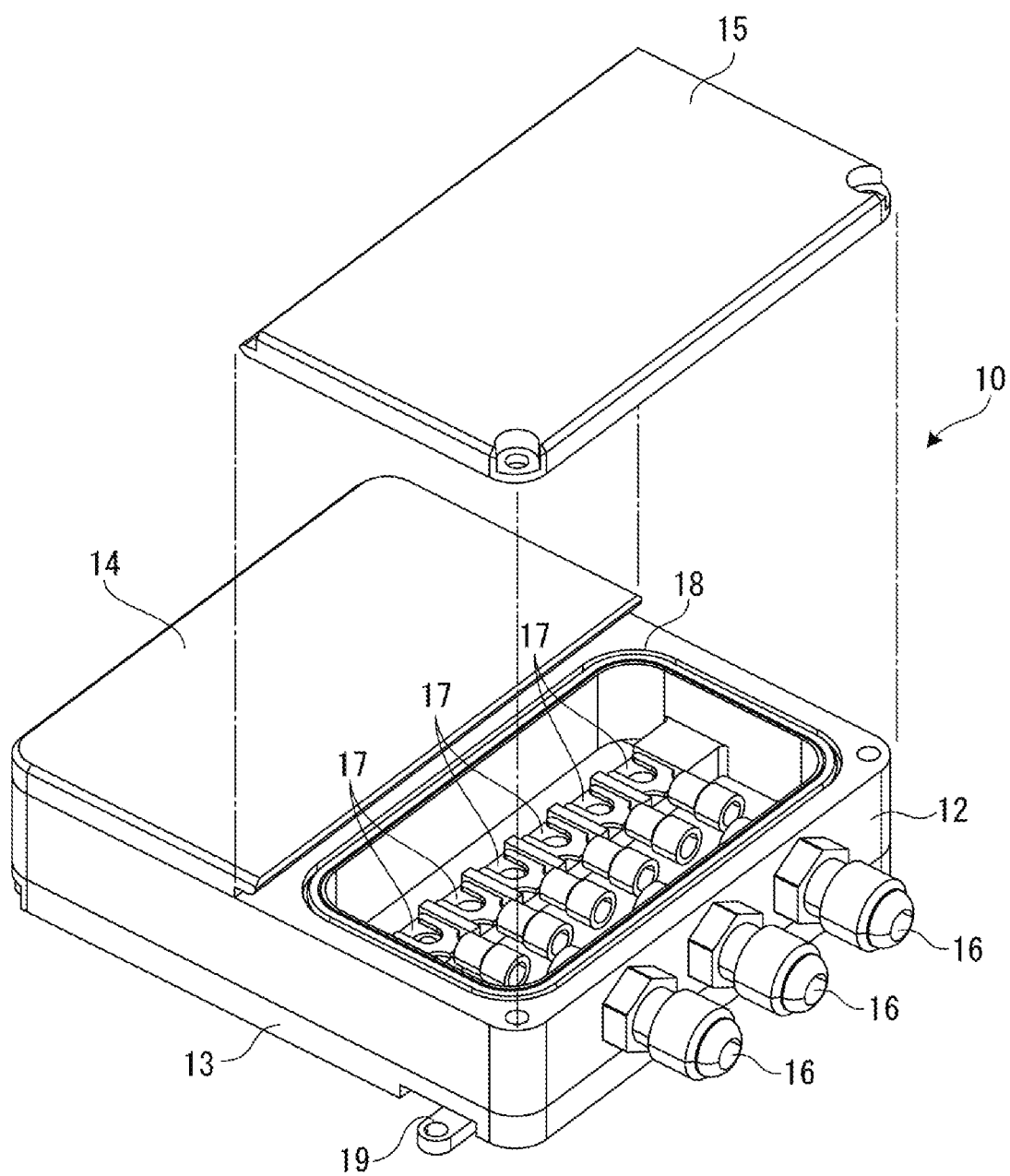
FIG. 2 shows a perspective view of an appearance of the thermoelectric generator transmitter according to the above exemplary embodiment.
Figure 3:
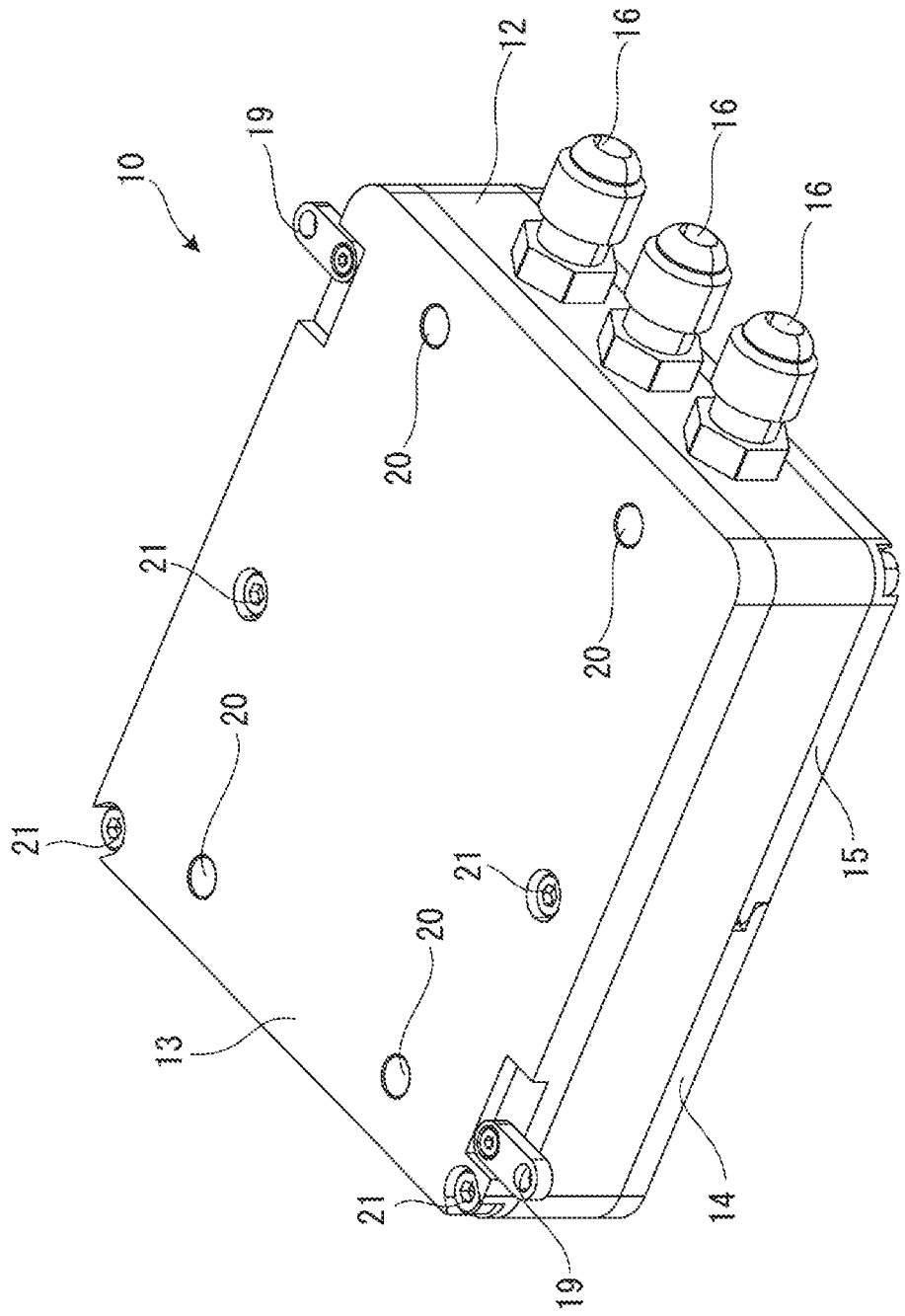
FIG. 3 shows another perspective view of the appearance of the thermoelectric generator transmitter according to the exemplary embodiment.
Figure 4:
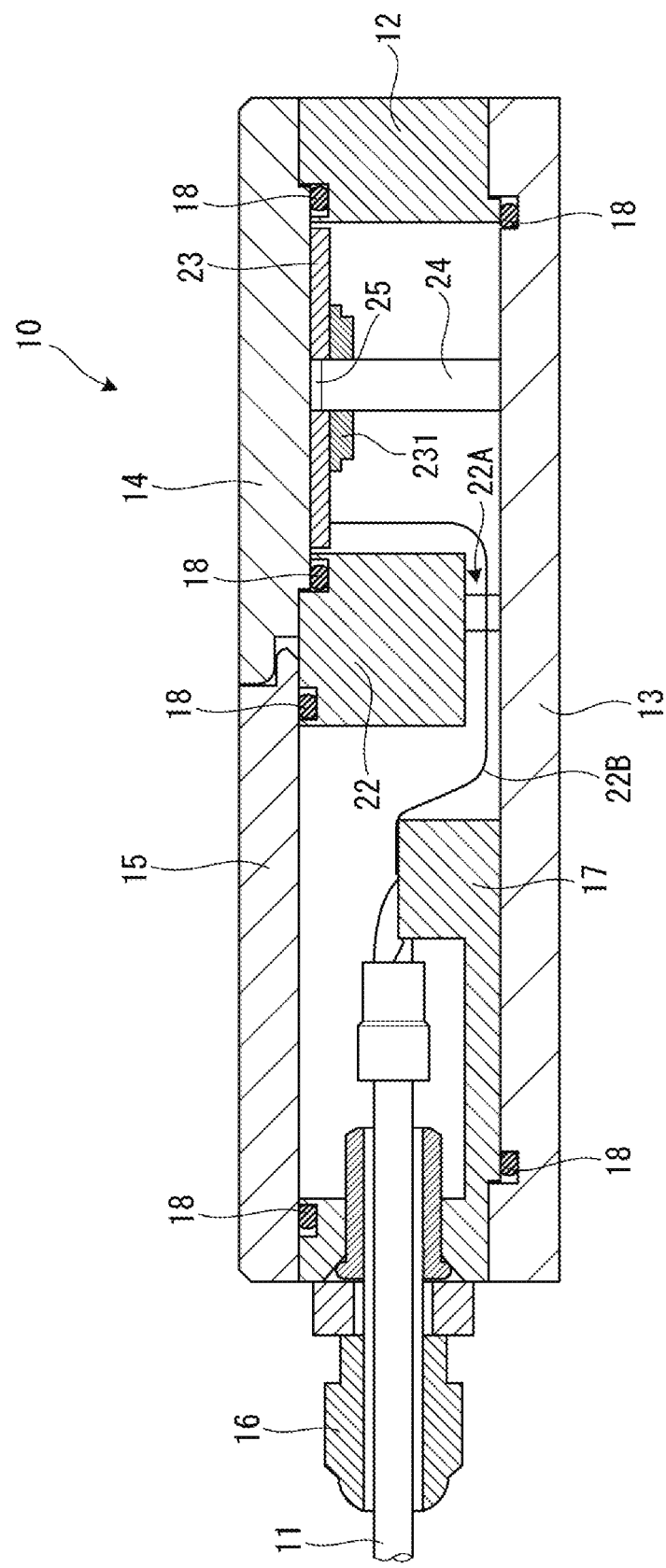
FIG. 4 shows a cross-sectional view of the thermoelectric generator transmitter according to the exemplary embodiment.

FIGS. 2 to 4 show the thermoelectric generator transmitter 10 according to the exemplary embodiment. FIG. 2 is a perspective view of the thermoelectric generator transmitter 10 as viewed from the top. FIG. 3 is a perspective view of the thermoelectric generator transmitter 10 as viewed from the bottom. FIG. 4 is a cross-sectional view of the thermoelectric generator transmitter 10.

The thermoelectric generator transmitter 10 is a transmitter that transmits a temperature detection signal detected by each of the thermocouples 11 to an external device by wireless radio waves. As shown in FIGS. 2 and 3, the thermoelectric generator transmitter 10 includes: an exterior frame 12, a heat-receiving plate 13, a radiator plate 14, a sealing plate 15, and cable glands 16.

The exterior frame 12, which is a hollow body having open ends and is rectangular in a plan view, is made of a plastic material (e.g., vinyl chloride and PPS) in order to output signals wirelessly. However, the material of the exterior frame 12 is not limited to the above. Any materials capable of securing heat resistance and having a radio-wave transmissivity are usable.

The heat-receiving plate 13 is a rectangular plate made of aluminum which entirely covers a first one of the open ends of the exterior frame 12.

The heat-receiving plate 14, which is a rectangular plate made of aluminum, covers approximately a half of a second one of the open ends of the exterior frame 12.

The sealing plate 15 is a member covering a part, which remains uncovered with the radiator plate 14, of the second one of the open ends of the exterior frame 12. The sealing plate 15 is a rectangular plate made of aluminum similar to the radiator plate 14.

The thermocouples 11 are inserted through the cable glands 16. As shown in FIG. 2, terminals of the thermocouples 11 are fixed with a screw and the like to terminal blocks 17 provided inside the exterior frame 12.

The terminal blocks 17, which are provided to a rear surface of the heat-receiving plate 13, each have a screw hole for fixing a cable of each of the thermocouples 11 and receive the detection signal of each of thermocouples 11.

An O-ring 18 (sealing member) is provided to the second one of the open ends of the exterior frame 12. The sealing plate 15 covers the second one of the open ends of the exterior frame 12 and is fixed to the exterior frame 12 with a screw and the like, thereby providing a tightly sealed structure. It should be noted that, as shown in FIG. 4, the open end covered with the heat-receiving plate 13 of the exterior frame 12 and the open end covered with the radiator plate 14 are also provided with the O-ring 18, thereby providing the sealed structure.

As shown in FIG. 3, an attachment 19 is provided at a peripheral end of a heat-receiving surface of the heat-receiving plate 13. The attachment 19 is attached to the heat-receiving plate 13 in a manner to be rotatable with a screw. The attachment 19 is rotated 90 degrees, whereby a portion having a hole projects outward with respect to the heat-receiving plate 13. The thermoelectric generator transmitter 10 can be fixed to a wall of the spindle head 6 (heat generation source) with a screw and the like through this hole.

Moreover, a magnet 20 is provided near the periphery of the heat-receiving surface of the heat-receiving plate 13, whereby the thermoelectric generator transmitter 10 can be temporarily fixed to the wall of the spindle head 6 (heat generation source).

Radiator-plate fixing screws 21 are inserted in the peripheral ends and a substantially middle portion of the heat-receiving plate 13. The radiator-plate fixing screws 21 penetrate the exterior frame 12 and are screwed into female screw holes (not shown) formed in the radiator plate 14, whereby the radiator plate 14 is fixed to the exterior frame 12.

With this fixing structure of the radiator plate 14, the radiator plate 14 is undetachable from the exterior frame 12 in the same direction as a direction for detaching the sealing plate 15 from the exterior frame 12 as shown in FIG. 2.

As shown in FIG. 4, a partition 22 is provided inside the exterior frame 12. The partition 22 is a wall for separating a location of the terminal blocks 17 from a location of components other than the terminal blocks 17.

Figure 5:
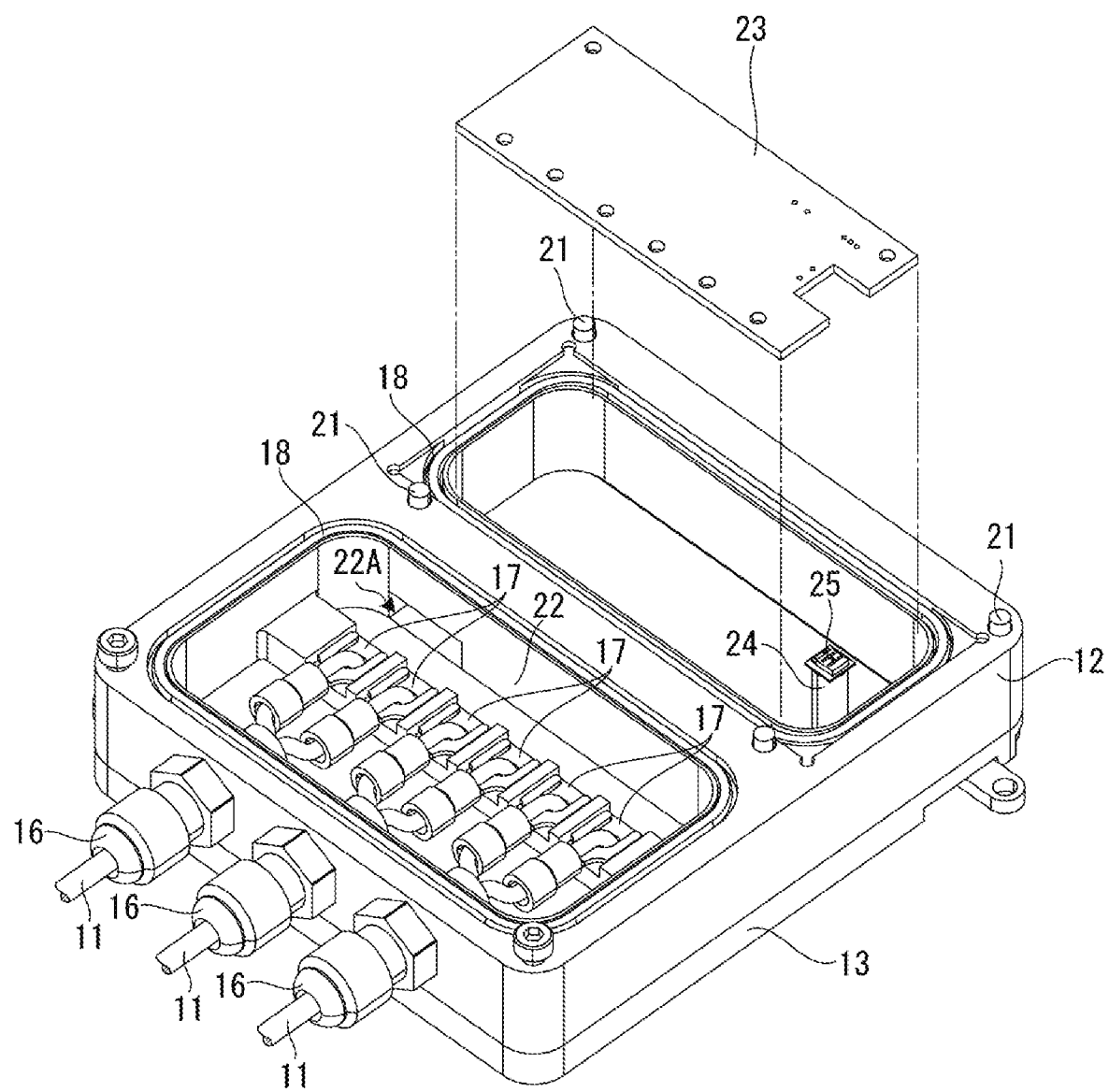
FIG. 5 shows a perspective view of an internal structure of the thermoelectric generator transmitter according to the exemplary embodiment.

As shown in FIGS. 4 and 5, an opening 22A is defined under the bottom of the partition 22. The opening 22A is provided so that signal lines 22B connecting the terminal blocks 17 and the circuit substrate 23 pass through the opening 22A. After the signal lines 22B connecting the terminal blocks 17 and the circuit substrate 23 pass through the opening 22A, the opening 22A is filled with a resin to be blocked (not shown in FIG. 4). With this treatment, the opening 22A can be sealed so as to avoid foreign substances having entered a side of the thermoelectric generator transmitter 10, where the terminal blocks 17 are located, from entering a side of the thermoelectric generator transmitter 10 in which the circuit substrate 23 is located.

An amount of the resin is determined to be enough to fill the opening 22A. A space is formed between the heat-receiving plate 13 and the radiator plate 14, thereby securing heat resistance between the heat-receiving plate 13 and the radiator plate 14. With this arrangement, a temperature difference in the thermoelectric generation module 25 between the heat-receiving plate 13 and the radiator plate 14 is maintained, thereby securing an efficient thermoelectric generation.

Figure 6:
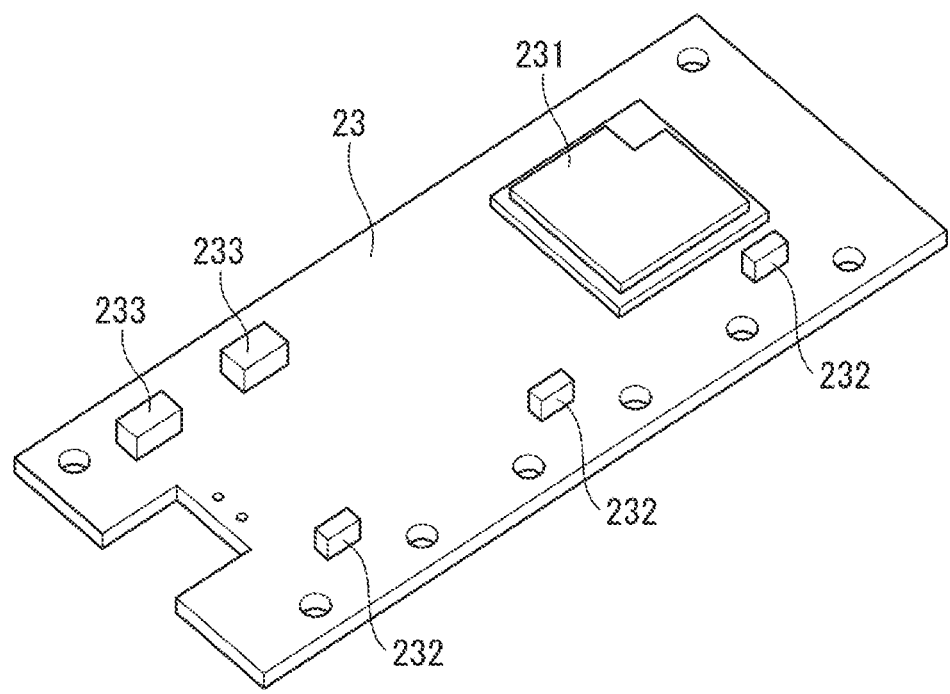
FIG. 6 shows a perspective view of a structure of a circuit board of the thermoelectric generator transmitter according to the exemplary embodiment.

As shown in FIG. 4, the circuit substrate 23 with a surface, on which circuit elements are installed, facing downward is tightly fixed to a rear surface of the radiator plate 14. As shown in FIG. 6, the processor 231, an amplifier circuit 232, and a pin socket 233 are installed on the circuit substrate 23.

The processor 231 converts a detection signal from the thermocouples 11 into a temperature detection signal and is capable of wirelessly outputting the obtained temperature detection signal to an external device.

The amplifier circuit 232 amplifies the detection signal obtained from the thermocouples 11 and outputs the amplified detection signal to the processor 231.

The pin socket 233 is attached with LED. The LED is turned ON or OFF in response to an input and an output of the signal at the processor 231.

As shown in FIG. 4, a columnar member 24 stands on a surface of the heat-receiving plate 13 shielding the opening of the exterior frame 12. The columnar member 24 is an aluminum-made columnar body integrally formed with the heat-receiving plate 13. The thermoelectric generation module 25 is interposed between the columnar member 24 and the radiator plate 14.

Figure 7:
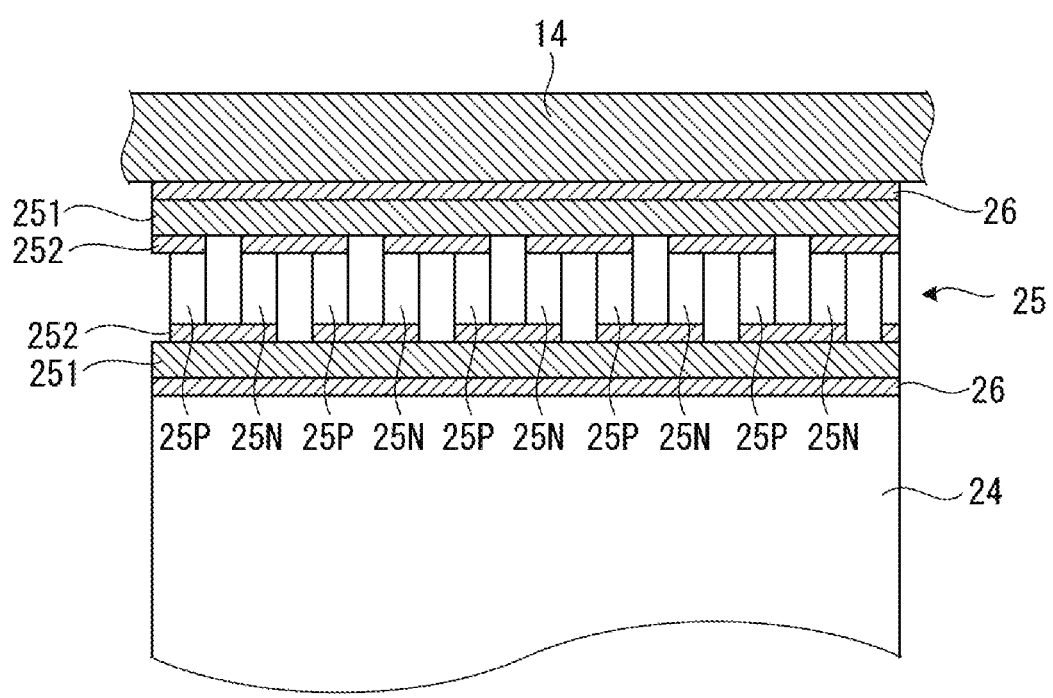
FIG. 7 shows a cross-sectional view of a structure of a thermoelectric generation module of the thermoelectric generator transmitter according to the exemplary embodiment.

As shown in FIG. 7, the thermoelectric generation module 25 includes substrates 251, electrodes 252, and thermoelectric elements 25P, 25N.

The substrates 251 in a pair, which are in a form of a ceramic film, a polyimide film and the like, are respectively disposed at a high-temperature side and a low-temperature side of the thermoelectric generation module 25 in a manner to face each other.

The electrodes 252 are provided on opposing surfaces of the corresponding substrates 251 and are made of a metallic material such as copper.

The thermoelectric elements 25P, 25N are interposed between the opposing electrodes 252. The P-type thermoelectric elements 25P and the N-type thermoelectric elements 25N are alternately arranged.

End surfaces of the P-type thermoelectric elements 25P and the N-type thermoelectric elements 25N are soldered to the electrodes 252, so that the thermoelectric generation module 25 forms a circuit in which the P-type thermoelectric elements 25P and the N-type thermoelectric elements 25N are alternately connected in series.

A highly thermally conductive carbon sheet, a heat transfer adhesive 26 or the like is interposed between the columnar member 24 and one of the substrates 251 of the thermoelectric generation module 25 and between the radiator plate 14 and the other of the substrates 251.

The carbon sheet, the heat transfer adhesive 26 or the like functions as a heat transfer layer that transfers heat of the columnar member 24 transferred from the heat-receiving plate 13 to the corresponding one of the substrates 251 while transferring the heat of the other (i.e., upper substrate) of the substrates 251 to the radiator plate 14 to radiate the heat. In other words, the columnar member 24, the thermoelectric generation module 25, and the radiator plate 14 are connected to each other in a manner capable of transferring heat to each other.

In the thermoelectric generation module 25 with this arrangement, the lower one of the substrates 251 receives heat from the columnar member 24 while the upper one of the substrates 251 transfers the heat to the radiator plate 14, so that a temperature difference is caused between the pair of substrates 251.

This temperature difference causes Seebeck effects to generate electromotive force in the circuit formed by the P-type thermoelectric elements 25P and the N-type thermoelectric elements 25N, leading to thermoelectric generation.

FIG. 8 shows a circuit structure of the thermoelectric generator transmitter 10. The thermoelectric generation module 25 is electrically connected to the processor 231 and the amplifier circuit 232 through a power supply circuit 27.

The power supply circuit 27 includes a capacitor 271, a step-up transformer 272, and a DC/DC converter 273.

Electric power generated by the thermoelectric generation module 25 is increased in voltage by the step-up transformer 272 and the DC/DC converter 273 and is charged in the capacitor 271.

The power supply circuit 27 monitors a threshold value of a charge voltage of the capacitor 271. When the charge voltage exceeds a predetermined output value, a signal is outputted from Vout2 of the DC/DC converter 273 to the processor 231 and the amplifier circuit 232, thereby driving the processor 231 and the amplifier circuit 232. The amplifier circuit 232 amplifies the detection signal obtained from the thermocouples 11 and outputs the amplified detection signal to the processor 231.

The processor 231 stores the detection signal in a memory, converts the detection signal into a predetermined format, and subsequently, outputs the temperature detection signal to an external device through a built-in wireless module. It should be noted that a timing of outputting the temperature detection signal to the external device depends on a temperature of the heat generation source since the charge voltage exceeding 3 V triggers the outputting of the temperature detection signal. When the electric power generated by the thermoelectric generation module 25 is large, a frequency where the charge voltage in the capacitor 271 exceeds 3V is increased. Accordingly, the temperature detection signal is outputted at short timings. The outputted temperature detection signal is received by a receiver of the external device.

[3] Setting Method of Thermoelectric Generator Transmitter 10

Next, a method of setting the thermoelectric generator transmitter 10 to the column type milling machine 1 will be described.

The thermoelectric generator transmitter 10 is attached, using the magnet 20, to a point of the spindle head 6 of the column type milling machine 1, the point having a highest temperature among the spindle head 6 housing the motor.

Next, it is checked whether the receiver can receive the signal wirelessly outputted from the processor 231.

After it is confirmed that the receiver can receive the signal from the processor 231, the sealing plate 15 is removed using a screwdriver and the like and the thermocouples 11 are screwed into the terminal blocks 17.

A tip end of each of the thermocouples 11 drawn through the cable glands 16 is attached to a measurement portion of the spindle head 6. With the attachment 19 being rotated, the thermoelectric generator transmitter 10 is firmly fixed to the spindle head 6 of the column type milling machine 1 using a screw and the like. Subsequently, the measurement is started.

[4] Operations and Advantages in Exemplary Embodiment(s)

In the above exemplary embodiment, the location of the thermoelectric generation module 25 and the processor 231 is separated from the location of the terminal blocks 17. With this arrangement, while the thermoelectric generation module 25 is kept in close contact with the columnar member 24 and the radiator plate 14, terminals of the thermocouples 11 can be attached to the respective terminal blocks 17. Accordingly, without reducing the power generation of the thermoelectric generator transmitter 10, an independent power supply can perform a sensing operation for a long time.

Particularly, with the partition 22 provided inside the thermoelectric generator transmitter 10 and further the opening 22A filled with the resin, an air flow can be completely blocked between the space in which the thermoelectric generation module 25 and the processor 231 are disposed and the space in which the terminal blocks 17 are disposed. Accordingly, dust can be completely prevented from entering the thermoelectric generation module 25 and the circuit substrate 23, whereby the thermoelectric generation module 25 and the circuit substrate 23 can be prevented from breaking down.

With the magnet 20 provided to the heat-receiving plate 13, the thermoelectric generator transmitter 10 can be temporarily fixed to a setting surface of the heat generation source to check whether the receiver receives the detection signal. Subsequently, the thermoelectric generator transmitter 10 is firmly fixed to the most suitable point of the motor (i.e., the heat generation source) and then the thermocouples 11 are attached to the most suitable positions, whereby a measurement can be conducted.

With the O-rings 18 provided to the open ends of the exterior frame 12, the heat-receiving plate 13, the radiator plate 14 and the sealing plate 15 covering the open ends of the exterior frame 12 form a sealed structure. Since this arrangement prevents foreign substances (e.g., metallic pieces) from entering an inside of the thermoelectric generator transmitter 10, the thermoelectric generator transmitter 10 can output a temperature measured by the thermocouples 11 for a long time on a basis of the independent power supply.

[5] Modification(s) of Exemplary Embodiment(s)

It should be understood that the scope of the invention is not limited to the above-described exemplary embodiment(s) but includes modifications and improvements as long as the modifications and improvements are compatible with the invention.

Although the thermocouples 11 are used as the sensor in the above exemplary embodiment, any sensor is usable. For instance, in some embodiments, another type of a sensor such as a thermistor and a strain gauge is used for signal output.

In the above exemplary embodiment, the columnar member 24 stands on the surface of the heat-receiving plate 13 blocking the opening of the exterior frame 12, and the thermoelectric generation module 25 is interposed between the columnar member 24 and the radiator plate 14. However, the invention is not limited to this arrangement.

Specifically, in some embodiments, a columnar member stands on the surface of the heat-receiving plate 13 blocking the opening of the exterior frame 12 while another columnar member stands on a surface of the radiator plate 14 blocking the opening of the exterior frame 12, and the thermoelectric generation module 25 is interposed between the columnar members. Alternatively, a columnar member stands on the surface of the radiator plate 14 blocking the opening of the exterior frame 12, and the thermoelectric generation module 25 is interposed between the columnar member and the heat-receiving plate 13.

Further, in the above exemplary embodiment, the heat-receiving plate 13 and the columnar member 24 are integrally formed. However, in some embodiments, the heat-receiving plate 13 and the columnar member 24 are formed in separate bodies and the heat transfer adhesive is interposed between the heat-receiving plate 13 and the columnar member 24, facilitating heat transfer.

In the above exemplary embodiment, the thermoelectric generator transmitter 10 is applied to the column type milling machine 1. However, the thermoelectric generator transmitter 10 is applicable to any machines. For instance, in some embodiments, the thermoelectric generator transmitter 10 is applied to external equipment.

In the above exemplary embodiment, the thermoelectric generator transmitter 10 is driven by the heat of the motor (i.e., the heat generation source) of the spindle head 6. However, the heat generation source is not limited to the motor. For instance, in some embodiments, a heat absorption source is in close contact with the heat-receiving plate 13 while the radiator plate 14 is exposed to a higher temperature. However, in this arrangement, the wires of the power supply circuit 27 need to be rearranged since an electric potential of electricity generated by the thermoelectric generation module 25 is inversed.

Further, the specific arrangements and configurations may be altered in any manner as long as the modifications and improvements are compatible with the invention.

The invention claimed is:

1. A thermoelectric generator transmitter that outputs a detection signal detected by a sensor to an outside with use of thermoelectric generation, the thermoelectric generator transmitter comprising:
   a hollow exterior frame with heat resistance and a radio-wave transmissivity, the exterior frame comprising open ends;
   a heat-receiving plate covering a first one of the open ends of the exterior frame and attached to a heat generation source or a heat absorption source;
   a radiator plate covering at least one part of a second one of the open ends of the exterior frame;
   a columnar member standing on at least one of a surface of the heat-receiving plate covering the exterior frame or a surface of the radiator plate covering the exterior frame, the columnar member being arranged so as to facilitate heat transfer between the columnar member and the heat-receiving plate or between the columnar member and the radiator plate;
   a thermoelectric generation module provided between the columnar member standing on the heat-receiving plate and the radiator plate, between the columnar member standing on the heat-receiving plate and the columnar member standing on the radiator plate, or between the columnar member standing on the radiator plate and the heat-receiving plate, wherein the thermoelectric generation module generates electricity by a temperature difference between the heat-receiving plate and the radiator plate;
   a processor provided to an inside of the exterior frame and that is drivable by electric power generated by the thermoelectric generation module and is capable of outputting the detection signal detected by the sensor to an external device; and
   a terminal that receives the detection signal of the sensor from the external device, wherein
   the inside of the exterior frame is divided into a location of the thermoelectric generation module and the processor and a location of the terminal.

2. The thermoelectric generator transmitter according to claim 1, further comprising:
   a partition interposed between the thermoelectric generation module and the processor, and the terminal.

3. The thermoelectric generator transmitter according to claim 2, wherein
   the second one of the open ends corresponding to the location of the terminal determined by the partition is covered with a sealing plate independent of the radiator plate, and
   the sealing plate is detachably attached to the exterior frame.

4. The thermoelectric generator transmitter according to claim 1, wherein
   a magnet is provided to a surface of the heat-receiving plate to be attached to the heat generation source or the heat absorption source.

5. The thermoelectric generator transmitter according to claim 1, wherein
   an attachment is provided to the surface of the heat-receiving plate to be attached to the heat generation source or the heat absorption source.

6. The thermoelectric generator transmitter according to claim 1, wherein
   the exterior frame and the heat-receiving plate, and the exterior frame and the radiator plate are sealed by a sealing member.

* * * * *